United States Patent
Suzuki et al.

(10) Patent No.: US 8,512,868 B2
(45) Date of Patent: Aug. 20, 2013

(54) HYBRID SILICON WAFER

(75) Inventors: Ryo Suzuki, Ibaraki (JP); Hiroshi Takamura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 25 days.

(21) Appl. No.: 13/499,304

(22) PCT Filed: Oct. 28, 2010

(86) PCT No.: PCT/JP2010/069140
§ 371 (c)(1),
(2), (4) Date: Mar. 30, 2012

(87) PCT Pub. No.: WO2011/055673
PCT Pub. Date: May 12, 2011

(65) Prior Publication Data
US 2012/0181536 A1 Jul. 19, 2012

(30) Foreign Application Priority Data
Nov. 6, 2009 (JP) ................................. 2009-255017

(51) Int. Cl.
*B32B 9/04* (2006.01)
*B32B 13/04* (2006.01)
*C01B 33/02* (2006.01)

(52) U.S. Cl.
USPC ........................... 428/446; 423/348; 423/349

(58) Field of Classification Search
USPC .................................. 423/348, 349; 428/446
See application file for complete search history.

(56) References Cited

U.S. PATENT DOCUMENTS

| 4,040,848 | A * | 8/1977 | Greskovich et al. ......... 501/96.3 |
| 5,965,904 | A * | 10/1999 | Ohtani et al. .................... 257/57 |
| 2008/0122042 | A1 * | 5/2008 | Goldstein et al. ............. 257/629 |
| 2010/0016144 | A1 | 1/2010 | Suzuki et al. |
| 2010/0187661 | A1 | 7/2010 | Suzuki et al. |
| 2010/0330325 | A1 | 12/2010 | Suzuki et al. |
| 2011/0123795 | A1 | 5/2011 | Satoh et al. |
| 2012/0009373 | A1 | 1/2012 | Takamura et al. |
| 2012/0009374 | A1 | 1/2012 | Takamura et al. |

FOREIGN PATENT DOCUMENTS

| JP | 3342898 B | 9/1993 |
| JP | 6-283469 A | 10/1994 |
| JP | 3819863 B | 10/2004 |
| JP | 2005-132671 A | 5/2005 |
| JP | 2008-101277 A | 5/2008 |

* cited by examiner

*Primary Examiner* — Jonathan Langman
(74) *Attorney, Agent, or Firm* — Howson & Howson LLP

(57) ABSTRACT

A hybrid silicon wafer which is a silicon wafer having a structure wherein the main plane orientation of polycrystalline silicon that is prepared by a unidirectional solidification/melting method is (311), and monocrystalline silicon is embedded in the polycrystalline silicon. The hybrid silicon wafer according to any one of claims 1 to 6, wherein the purity of the polycrystalline silicon portion excluding gas components is 6N or higher, the total amount of metal impurities is 1 wtppm or less, and, among the metal impurities, Cu, Fe, Ni, and Al are respectively 0.1 wtppm or less. Thus, a hybrid silicon wafer having the functions of both a polycrystalline silicon wafer and a monocrystalline silicon wafer is provided and the occurrence of polish bumps and macro-sized unevenness between the polycrystalline silicon and the monocrystalline silicon are prevented.

10 Claims, 1 Drawing Sheet

*In the following figures, a scaly pattern indicates the shape of crystal grains of the polycrystalline portion.

Columnar polycrystalline silicon ingot

Partially hollowed polycrystalline silicon ingot (diameter: 450 mm) and monocrystalline silicon ingot (diameter: 300 mm)

Complex of polycrystalline silicon and monocrystalline silicon ingot diffusion-bonded to each other

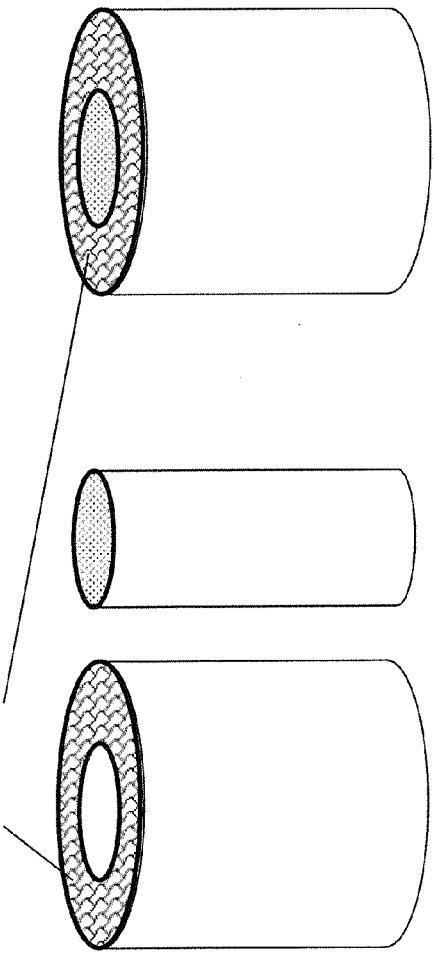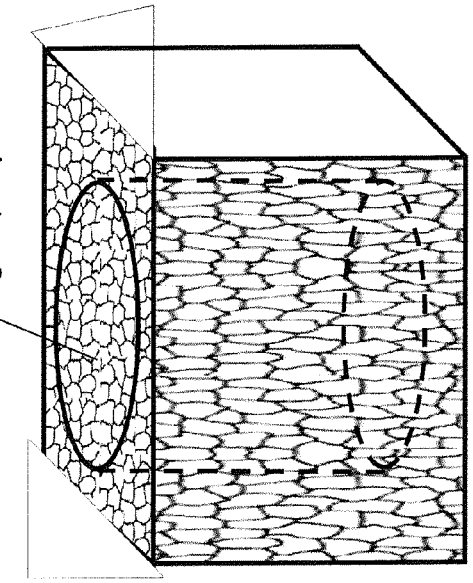

HYBRID SILICON WAFER

BACKGROUND

The present invention relates to a hybrid silicon wafer comprising the functions of both a polycrystalline silicon wafer and a monocrystalline wafer.

In the silicon semiconductor manufacturing process, a wafer prepared based on monocrystal growth is primarily used. This monocrystalline silicon wafer has increased in size with the times, and it is anticipated that the inner diameter thereof will become 400 mm or larger in the near future. In addition, a so-called mechanical wafer for use in testing is now required in order to establish the apparatus and peripheral technology necessary for the semiconductor manufacturing process.

Generally speaking, since this kind of mechanical wafer is subject to fairly high precision testing, it needs to possess characteristics that are similar to the mechanical physicality of a monocrystalline silicon. Thus, conventionally, although it was to be used for testing, in reality the monocrystalline silicon wafer was being used as is. However, since a monocrystalline silicon wafer having an inner diameter of 400 mm or larger is extremely expensive, an inexpensive wafer having characteristics that are similar to a monocrystalline silicon is in demand.

Meanwhile, as a component of such semiconductor manufacturing equipment, a proposal has also been made for using a sputtering target formed from a rectangular or disk-shaped silicon plate. The sputtering method is being used as a means for forming thin films, and there are several sputtering methods including the bipolar DC sputtering method, radio frequency sputtering method, magnetron sputtering method and the like, and thin films of various electronic parts are being formed using the sputtering characteristics unique to the respective methods.

This sputtering method is a method that faces a substrate as the anode and a target as the cathode, and generates an electrical field by applying a high voltage between the foregoing substrate and target under an inert gas atmosphere. Here, the ionized electrons and inert gas collide to form a plasma, the cations in the plasma collide with the target surface to hammer out the target constituent atoms, and the discharged atoms adhere to the opposite substrate surface so as to form a film.

A polycrystalline silicon sintered compact is proposed for this kind of sputtering target, and this sintered compact target is demanded of considerable thickness, large size and a rectangular or disk shape in order to improve the deposition efficiency. Moreover, a proposal has also been made for using this polycrystalline silicon sintered compact as a board for retaining the monocrystalline silicon wafer. Nevertheless, a polycrystalline silicon entails significant problems in that the sinterability is inferior, the obtained products have low density, and the mechanical strength is low.

In light of the above, in order to improve the characteristics of the foregoing silicon sintered compact, proposed is a silicon sintered compact formed by compression-molding and sintering silicon powder obtained by being heated and deoxidized under reduced pressure and within a temperature range that is 1200° C. or higher and less than the melting point of silicon, and setting the crystal grain size of the sintered compact to be 100 μm or less (for instance, refer to Patent Document 1).

If the thickness of the silicon sintered compact manufactured as described above is thin; for instance, 5 mm or less, the density will relatively increase and the strength will also increase, however, the thickness becomes much thicker the density will continue to be a low density (less than 99%), and the mechanical strength will also deteriorate. Thus, there is a problem in that manufacturing a large-size rectangular or disk-shaped silicon sintered compact is not possible.

In light of the foregoing circumstances, the present applicant previously proposed a silicon sintered compact and its production method in which the average crystal grain size is 50 μm or less and the relative density is 99% or more (refer to Patent Document 2).

Although this silicon sintered compact possesses numerous advantages including high density and high mechanical strength, the further improvement of these characteristics is being demanded, and the applicant filed a patent application relating to technology that improved the foregoing points.

Since a wafer using the foregoing silicon sintered compact has similar mechanical properties as a monocrystalline silicon, it can be used as a dummy wafer for the transport system of semiconductor manufacturing equipment or the development of robotics. In addition, the application of an SOI wafer as a base substrate is also being considered.

Nevertheless, these are all polycrystalline silicons made from a silicon sintered compact, and although there are numerous points that are similar to the physical properties of a monocrystal, they do not possess the functions as the monocrystal itself, and there is a fundamental problem in that they cannot be used for process testing such as deposition experiments.

Moreover, there is also a proposal of manufacturing a high quality polycrystalline silicon in substitute for a monocrystalline silicon (refer to Patent Document 3). Nevertheless, a polycrystalline silicon has a drawback in that, no matter what kind of devisal is made, its characteristics will be inferior to a monocrystalline silicon.

Moreover, with respect to the patent application that was previously filed by the applicant, since a sintered silicon is used at a polycrystalline portion, the crystal orientation becomes random, and there is a problem in that unevenness occurs during the grinding process, and a problem in that a large amount of gas component impurities will be included (refer to Patent Document 4).

[Patent Document 1] Japanese Patent No. 3342898
[Patent Document 2] Japanese Patent No. 3819863
[Patent Document 3] Japanese Unexamined Patent Application Publication No. 2005-132671
[Patent Document 4] Japanese Patent Application No. 2008-179988

SUMMARY OF THE INVENTION

As described above, the shape of a monocrystalline wafer that is used in the LSI process is becoming a greater diameter with the times, and a monocrystalline wafer having a diameter of 400 mm or more is becoming standard. Nevertheless, a monocrystalline wafer having a diameter of 400 mm or more is extremely expensive, and consequently its dummy wafer is also expensive, and costs of the LSI process will thereby increase. Moreover, with a monocrystalline silicon wafer of a large diameter; for instance, a diameter of 400 mm or more, there is concern that the cracks of the monocrystalline cleavage surface will increase and the production yield will deteriorate compared to a conventional 300 mm wafer.

Thus, an object of the present invention is to inexpensively provide a hybrid wafer by using a general-purpose 300 mm monocrystal and which can be applied to a dummy wafer of 400 mm or larger, as well as improve the production yield by improving the strength of the dummy wafer. In other words, an object of the present invention is to provide a hybrid silicon wafer comprising the functions of both a polycrystalline silicon wafer and a monocrystalline silicon wafer.

Although a sintered silicon may be used at the polycrystalline silicon portion of the hybrid wafer, since there is a large amount of gas components such as C and O compared to a melted Si ingot, and SiC and $SiO_2$ of high hardness precipitate at the crystal grain boundary, the polishing rate is slow in the mirror polishing process compared to the monocrystalline silicon portion, and there is a problem in that unevenness will occur in the thickness of the monocrystalline silicon portion and the polycrystalline silicon portion.

As a measure for resolving the foregoing problem, a molten Si ingot with a low content of gas components such as C and O can be used in the polycrystalline silicon portion. Nevertheless, since the crystal grain size of a molten Si ingot is generally large at several mm to several 10 mm, macro-sized unevenness will arise due to the difference in the polishing rate caused by the orientation of the respective crystal grains. Thus, the present invention aims to devise a way of eliminating the unevenness between the polycrystalline silicon portion and the monocrystalline portion of the hybrid silicon wafer during the polishing process.

In order to achieve the foregoing object, the present inventors discovered that it is possible to obtain a polycrystalline silicon with improved mechanical strength, and achieve a hybrid silicon wafer comprising functions of both the polycrystalline silicon wafer and the monocrystalline silicon wafer by embedding monocrystalline silicon in the foregoing polycrystalline silicon. In addition, the present inventors focused on the fact that, as the plane that is perpendicular to the solidifying direction of the Si ingot prepared by the unidirectional solidification method, the (311) plane orientation substantially becomes the main orientation, and discovered that it is possible to prevent the occurrence of macro-sized unevenness on the foregoing polished surface as well as eliminate the unevenness between the polycrystalline silicon portion and the monocrystalline portion by causing this plane to become the plane of the polycrystalline silicon portion of the hybrid silicon wafer.

Based on the foregoing discovery, the present invention provides:
1) A hybrid silicon wafer which is a silicon wafer having a structure wherein the main plane orientation of polycrystalline silicon that is prepared by a unidirectional solidification/melting method is (311), and monocrystalline silicon is embedded in the polycrystalline silicon;
2) The hybrid silicon wafer according to 1) above, wherein bonding interfaces of the polycrystalline silicon prepared by the unidirectional solidification/melting method and the monocrystalline silicon are diffusion-bonded;
3) The hybrid silicon wafer according to 1) or 2) above, wherein the area ratio of the monocrystalline silicon relative to the entire area of the wafer surface is 30% or more;
4) The hybrid silicon wafer according to any one of 1) to 3) above, wherein the purity of the polycrystalline silicon portion excluding gas components is 6N or higher, the total amount of metal impurities is 1 wtppm or less, and, among the metal impurities, Cu, Fe, Ni, and Al are respectively 0.1 wtppm or less;
5) The hybrid silicon wafer according to any one of 1) to 4) above, wherein C and O as the gas components of the polycrystalline silicon portion are respectively 100 wtppm or less; and
6) The hybrid silicon wafer according to any one of 1) to 5) above, wherein the wafer is a disk shape and the diameter of the overall wafer is 400 mm or more.

Since it is possible to provide a hybrid silicon wafer comprising functions of both the polycrystalline silicon wafer and the monocrystalline wafer based on the above, a significant effect is yielded in that the characteristics and functions as a monocrystalline wafer and the characteristics and functions as a polycrystalline silicon wafer can be simultaneously retained. A polycrystalline silicon wafer as the support base of the hybrid silicon wafer needs to be enlarged and strengthened by necessity.

The polycrystalline silicon wafer which the hybrid silicon wafer of the present invention comprises has characteristics that are similar to the mechanical properties of monocrystalline silicon that is used as a dummy wafer. Specifically, since the strength is high, it is free from cracks and chipping, and it can be easily processed into complex shapes, and the polycrystalline silicon wafer can be machined for embedding the monocrystalline silicon. Based on these characteristics, a small diameter monocrystalline silicon that is relatively inexpensive can be used, and monocrystalline silicon of an appropriate size can be embedded in the required portion.

Moreover, since the polycrystalline silicon can also be manufactured as a large ingot, a hybrid silicon wafer can be manufactured by embedding a monocrystalline ingot in the large ingot, bonding the interfaces thereof, and slicing the bonded body. Accordingly, a hybrid silicon wafer comprising functions of both the polycrystalline silicon wafer and the monocrystalline wafer has a significant feature of being able to considerably improve the production yield and reduce manufacturing costs compared to an independent monocrystalline wafer of the same size. In other words, as a result of using a polycrystalline silicon ingot for use in solar cells and a 300 mm monocrystalline silicon, it is possible to prepare an inexpensive dummy silicon wafer of 400 mm or larger.

Furthermore, a dummy silicon wafer prepared by using a polycrystalline silicon ingot having a purity of 6N or higher is characterized in that it will not contaminate the process unit or other components even when it is introduced into the process unit. A significant effect is yielded in that the strength of the hybrid silicon wafer can be increased, and the deterioration in the production yield caused by cracks in the cleavage of the wafer can be prevented.

In addition, as a result of focusing on the fact that the main plane orientation of the plane that is perpendicular to the solidifying method of the polycrystalline silicon ingot prepared by the unidirectional solidification/melting method becomes (311), and utilizing the fact that the polishing rate becomes similar for the embedded monocrystalline portion, a superior effect is yielded in that it is possible to inhibit the occurrence of polish bumps and macro-sized unevenness between the polycrystalline silicon and the monocrystalline silicon.

BRIEF DESCRIPTION OF THE DRAWINGS

FIG. 1 is an explanatory diagram of the process of using a polycrystalline silicon ingot, hollowing a part of this polycrystalline silicon ingot, and inserting a pre-produced monocrystalline ingot into the hollowed portion.

DETAILED DESCRIPTION

The hybrid silicon wafer of the present invention comprises a structure in which a monocrystalline wafer is embedded in the polycrystalline silicon wafer. Specifically, a single hybrid silicon wafer has a structure in which a polycrystalline silicon wafer and a monocrystalline wafer coexist. To put it differently, this hybrid silicon wafer takes on a structure in which a monocrystalline wafer is retained in the polycrystalline silicon wafer.

The respective surfaces of the polycrystalline silicon wafer and the monocrystalline wafer are exposed on the surface, and comprise an equal polished surface since they are simultaneously subject to machining and processing during the manufacturing stage. Under normal circumstances, the difference in surface roughness Ra of the respective surfaces of the polycrystalline silicon wafer and the monocrystalline wafer is desirably 0.02 µm or less.

In particular, the hybrid silicon wafer is unique in that it has a structure wherein the monocrystalline silicon is embedded in the polycrystalline silicon prepared by the unidirectional solidification/melting method. The greatest weakness of the monocrystalline silicon wafer is the deterioration of the breaking strength (deflecting strength) when the wafer diameter is enlarged, but the present invention is able to overcome this weakness.

Desirably, the bonding interfaces of the polycrystalline silicon prepared by the unidirectional solidification/melting method and the monocrystalline silicon are diffusion-bonded. It is thereby possible to reliably bond the two silicons. Moreover, desirably, the area ratio of the monocrystalline silicon relative to the entire area of the wafer surface is 30% or more. This is in aim to increase the area of effectively utilizing the monocrystalline silicon.

In the foregoing case, a major problem is the occurrence of polish bumps or macro-sized unevenness of the polished surface of the polycrystalline silicon portion and the monocrystalline portion of the hybrid silicon wafer. Nevertheless, the present invention focused on the fact that the main plane orientation of the plane that is perpendicular to the solidifying method of the polycrystalline silicon ingot prepared by the unidirectional solidification/melting method becomes (311), it was discovered that the polishing rate becomes similar for the embedded monocrystalline portion.

The present invention utilizes this phenomenon and is able to considerably inhibit the occurrence of polish bumps and macro-sized unevenness between the polycrystalline silicon and the monocrystalline silicon.

With the hybrid silicon wafer, desirably, the purity of the polycrystalline silicon portion excluding gas components is 6N or higher, the total amount of metal impurities is 1 wtppm or less, and, among the metal impurities, Cu, Fe, Ni, and Al are respectively 0.1 wtppm or less. Moreover, desirably, C and O as the gas components of the polycrystalline silicon portion are respectively 100 wtppm or less. A dummy silicon wafer prepared as described above is unique in that it will not, even when introduced into the process unit, contaminate the unit and other members. It is thereby possible to further increase the utility value of a disk shape wafer having an overall diameter of 400 mm or larger.

The polycrystalline silicon wafer to become the support base of the monocrystalline silicon wafer can be manufactured in a large size. Meanwhile, it is extremely expensive to prepare a monocrystalline silicon wafer in a large size exceeding an inner diameter of 400 mm since the production yield is low. However, with a polycrystalline silicon wafer, it is easy to prepare a silicon wafer having an inner diameter of 400 mm or more.

Accordingly, for instance, with a hybrid wafer in which a disk-shaped monocrystalline silicon wafer is embedded in a part of a disk-shaped polycrystalline silicon wafer having an inner diameter of 400 mm or more, a large-diameter dummy wafer can be manufactured easily and inexpensively.

It should be easily understood that the shape of these wafers is not limited to a disk shape but may be manufactured in a rectangular shape or the like. And the shape of the monocrystalline silicon to be embedded is not limited to a disk shape but can also be prepared in a rectangular, ellipse/oval, race track shape or the like.

Although there is no particular limitation regarding the size of the monocrystalline silicon, desirably, the longest diameter of the monocrystalline silicon portion is 50% or more of the diameter of the overall wafer. Consequently, the hybrid silicon wafer can be effectively utilized in tests that use the characteristics of a monocrystalline wafer. This is particularly effective when causing the embedding position of the monocrystal to be eccentric and testing the distribution in the radial direction.

Moreover, since the monocrystalline silicon portion can be embedded in various shapes simultaneously such as a rectangular, ellipse/oval, race track shape in addition to a disk shape, in the foregoing case, the surface area of the monocrystalline silicon portion can be made to be 30% or more of the surface area of the overall wafer.

Nevertheless, the present invention is not limited to the foregoing shapes. Limitation in the size is the size of the monocrystalline wafer that can be retained in the polycrystalline silicon wafer, and there is no particular limitation. Moreover, it is also possible to embed a monocrystalline wafer that is smaller than the foregoing examples. Furthermore, in order to increase the bonding strength of the polycrystalline silicon wafer and the monocrystalline wafer, desirably, the bonding interfaces are mutually diffusion-bonded. Depending on the usage, an adhesive layer may also be inserted therebetween.

Upon manufacturing the hybrid silicon wafer of the present invention, as described above, a part of the polycrystalline silicon that is prepared in advance via the unidirectional solidification/melting method is hollowed, a monocrystalline ingot is inserted into the hollowed portion, and the polycrystalline sintered silicon and the monocrystalline ingot are mutually bonded through thermal diffusion bonding to prepare a complex of the polycrystalline sintered silicon and the monocrystalline silicon ingot.

Subsequently, the complex is sliced to prepare a hybrid silicon wafer having a structure in which a monocrystalline wafer is embedded in a polycrystalline silicon.

This manufacturing method aims to manufacture numerous hybrid silicon wafers at once, but a hybrid silicon wafer can also be manufactured one by one as a matter of course.

In the foregoing case, the main plane orientation of the plane that is perpendicular to the solidifying method of the polycrystalline silicon ingot prepared by the unidirectional solidification/melting method becomes (311), but since the polishing rate becomes similar for the embedded monocrystalline plane, these are arranged to the same plane. In other words, the monocrystals are embedded to be the same plane as the plane that is perpendicular to the solidifying direction of the polycrystalline silicon ingot. Consequently, the sliced hybrid silicon wafer of the present invention is able to considerably inhibit the occurrence of polish bumps and macro-sized unevenness between the polycrystalline silicon and the monocrystalline silicon.

Moreover, upon manufacturing the hybrid silicon wafer of the present invention, in order to achieve the same characteristics as a monocrystalline silicon wafer, desirably, the purity of the polycrystalline silicon portion excluding gas components is 6N or higher, the total amount of metal impurities is 1 wtppm or less, and, among the metal impurities, Cu, Fe, Ni, and Al are respectively 0.1 wtppm or less. More preferably, C and O as the gas components of the polycrystalline silicon portion are respectively 100 wtppm or less. It is thereby possible to improve the overall characteristics of the hybrid silicon wafer.

The foregoing hybrid silicon wafer is able to effectively utilize the function as a monocrystalline wafer, and it can also be used as a test wafer of equipment testing such as deposition experiments on a monocrystal. Moreover, since the function as the polycrystalline silicon wafer; that is, the mechanical strength is high and the workability is superior, the present invention can also be used as various parts of semiconductor manufacturing equipment such as a holder. Upon manufacturing polycrystalline parts, the silicon wafer is free from the generation of cracks and chipping and can also be easily processed into complex shapes, and therefore yields a superior effect of being able to considerably improve the production yield and reduce the manufacturing costs.

Accordingly, the "hybrid silicon wafer" of the present invention is available for multipurpose utilization, and a silicon wafer comprising the foregoing characteristics did not conventionally exist.

EXAMPLES

The present invention is now explained in detail with reference to the Examples. These Examples are merely for facilitating the understanding of this invention, and the present invention shall in no way be limited thereby. In other words, various modifications and other embodiments based on the technical spirit claimed in the claims shall be covered by the present invention as a matter of course.

Example 1

A columnar structure polycrystalline silicon ingot having a purity of 6N was prepared by the unidirectional solidification/melting method. Here, the main plane orientation of the plane that is perpendicular to the solidifying direction of the columnar structure polycrystalline silicon ingot prepared by the unidirectional solidification/melting method was (311).

Subsequently, as shown in FIG. 1, this polycrystalline silicon (diameter of 450 mm) ingot was used, a part of the polycrystalline silicon ingot was hollowed, and a pre-produced monocrystalline ingot (diameter of 300 mm) was inserted into the hollowed portion. Here, the monocrystals were embedded in the polycrystalline silicon ingot so that they become the same plane as the plane that is perpendicular to the solidifying direction of the polycrystalline silicon ingot (that is, as shown in FIG. 1, plane in which the main plane orientation is (311)). Normally, the surface obtained by slicing the monocrystalline silicon ingot possess the (100) orientation.

Moreover, in this Example, in order to increase the purity of the polycrystalline silicon portion as much as possible, used was a raw material in which the purity excluding gas components is 6N or higher, the total amount of metal impurities is 1 wtppm or less, and, among the metal impurities, Cu, Fe, Ni, and Al are respectively 0.1 wtppm or less, and C and O as gas components are respectively 100 wtppm or less.

The clearance between the polycrystalline silicon ingot and the monocrystalline ingot was set to 0.1 mm or less. Subsequently, the polycrystalline silicon ingot and the monocrystalline ingot were mutually subject to thermal diffusion-bonding based on HIP by being heat at 1200° C. for 2 hours, and a complex of the polycrystalline silicon and monocrystalline silicon ingots.

The complex prepared as described above was sliced into a thickness of 1.01 mm, and a hybrid wafer having a structure where a monocrystalline wafer having a diameter of 300 mm is embedded in a polycrystalline silicon wafer having a diameter of 450 mm was prepared.

Next, the sliced surfaces (both surfaces) were subject to thickness adjustment through rough grinding and thereafter subject to mirror polishing to obtain a mirrored hybrid silicon wafer having an average surface roughness of Ra 0.02 µm.

Subsequently, the bumps between the crystals of the polycrystalline silicon portion and the unevenness between the monocrystalline silicon portion and the polycrystalline silicon portion of the hybrid wafer prepared as described above were measured. Consequently, the bumps between the crystals were 0.02 µm or less and the unevenness between the polycrystalline silicon portion and the monocrystalline silicon portion was also 0.02 µm or less, and the polished surface was satisfactory as a hybrid wafer, and even as a dummy wafer.

Accordingly, the sliced hybrid silicon wafer of the present invention was able to considerably inhibit the occurrence of polish bumps and macro-sized unevenness between the polycrystalline silicon and the monocrystalline silicon. Moreover, it was possible to obtain a hybrid silicon wafer having a structure where a monocrystalline wafer is embedded in a polycrystalline silicon wafer which is free from peeling and cracks, and in which the bonding interface is free from the generation of pores.

When using the polycrystalline silicon wafer prepared by the unidirectional solidification/melting method as described above, since the strength of the polycrystalline silicon wafer can be adjusted and the breaking load can be sufficiently increased as a result of adjusting the crystal orientation and/or the crystal grain shape, for instance, when processed into a hybrid silicon wafer, there were no cracks or chipping even when the diameter of the wafer was increased to 400 mm, 450 mm, and 680 mm.

Note that, since the inclusion of impurities in the polycrystalline silicon is undesirable, silicon having a purity of 6N was used, but even silicon having a purity level of 5N can be used without any problem so as long as the impurities of Cu, Fe, Ni, and Al are 0.1 wtppm or less, respectively. Moreover, when the purity of silicon is 5N or higher, the mechanical properties were not affected in any way.

Comparative Example 1

A hybrid wafer was prepared as with Example 1 other than using a silicon ingot prepared by the normal melting method in which the crystal orientation is random, and the polished surface was evaluated. Consequently, the maximum bump between the crystal grains of the polycrystalline silicon portion was 0.05 µm, and this did not satisfy the level of use as a dummy wafer.

Comparative Example 2

A hybrid wafer was prepared as with Example 1 other than using a silicon prepared by the sintering method in the polycrystalline silicon portion, and the polished surface was similarly evaluated. Consequently, although the bumps between the crystals at the polycrystalline silicon portion were 0.02 µm or less and satisfied the specifications demanded in a dummy wafer, the maximum unevenness between the polycrystalline silicon portion and the monocrystalline silicon portion was 0.08 µm, and this did not satisfy the level of use as a dummy wafer.

Example 3

Prepared was a hybrid silicon wafer in which Cu and Fe as impurities in the polycrystalline silicon portion were respectively 0.5 wtppm and 0.3 wtppm, Ni and Al were respectively 0.1 wtppm or less, and the purity excluding gas components was 6N or higher.

In the foregoing case, upon conducting a thermal transfer test in order to examine the influence of Cu and Fe as impurities, transfer of Cu and Fe to the contacted monocrystalline wafer was observed. Accordingly, this cannot be used as a dummy wafer for use in a process including heat treatment at a high temperature. However, the influence of Cu and Fe as impurities was not that significant, and this could be sufficiently used as a dummy wafer in a process that does not include heat treatment at a high temperature.

Example 4

Prepared was a hybrid silicon wafer in which Cu, Fe, Ni, and Al as impurities in the polycrystalline silicon portion were respectively 0.8 wtppm, 1.2 wtppm, 0.3 wtppm, and 0.6 wtppm, and the purity excluding gas components was 5N or higher.

In the foregoing case, upon conducting a thermal transfer test in order to examine the influence of Cu, Fe, Ni, and Al as impurities, transfer of Cu, Fe, Ni, and Al to the contacted monocrystalline wafer was observed. However, the transfer of other impurities could not be observed.

Accordingly, this cannot be used as a dummy wafer for use in a process including heat treatment at a high temperature. However, the influence of Cu, Fe, Ni, and Al as impurities was not that significant, and this could be sufficiently used as a dummy wafer in a process that does not include heat treatment at a high temperature.

Based on foregoing Example 3 and Example 4, for use as a dummy wafer in a process including heat treatment at a high temperature, desirably, the purity of the polycrystalline silicon portion excluding gas components is 6N or higher, the total amount of metal impurities is 1 wtppm or less, and, among the metal impurities, Cu, Fe, Ni, and Al are respectively 0.1 wtppm or less. However, when the influence of Cu, Fe, Ni, and Al as impurities is not that significant; that is, even in cases of a hybrid silicon wafer of a 5N-level polycrystalline silicon portion, it was confirmed that this could be sufficiently used as a dummy wafer in a process that does not include heat treatment at a high temperature.

Since it is possible to provide a hybrid silicon wafer comprising functions of both the polycrystalline silicon wafer prepared by the unidirectional solidification/melting method and the monocrystalline wafer based on the above, a significant effect is yielded in that the characteristics and functions as a monocrystalline wafer and the characteristics and functions as a polycrystalline silicon wafer prepared by the unidirectional solidification/melting method can be simultaneously retained.

A polycrystalline silicon wafer as the support base of the hybrid silicon wafer needs to be enlarged and strengthened by necessity. The polycrystalline silicon wafer prepared by the unidirectional solidification/melting method which the hybrid silicon wafer of the present invention comprises has characteristics that are similar to the mechanical properties of monocrystalline silicon that is used as a dummy wafer.

Specifically, the strength is high, it is free from cracks and chipping, and the polycrystalline silicon wafer can be easily processed into complex shapes. Thus, a hybrid silicon wafer comprising functions of both the polycrystalline silicon wafer and the monocrystalline wafer has a significant feature of being able to considerably improve the production yield and reduce manufacturing costs.

In addition, as a result of embedding the monocrystals so that they become the same plane as the plane that is perpendicular to the solidifying direction of the polycrystalline silicon ingot, the sliced hybrid silicon wafer of the present invention yields a superior effect of being able to inhibit the occurrence of polish bumps and macro-size unevenness between the polycrystalline silicon and the monocrystalline silicon. Thus, the present invention is useful as a test wafer deposition devices or the like, or as a sputtering target or various components of semiconductor manufacturing equipment.

The invention claimed is:

1. A hybrid silicon wafer which is a silicon wafer having a structure wherein a main plane orientation of polycrystalline silicon that is prepared by a unidirectional solidification/melting method is (311), and monocrystalline silicon is embedded in the polycrystalline silicon.

2. The hybrid silicon wafer according to claim 1, wherein bonding interfaces of the polycrystalline silicon prepared by the unidirectional solidification/melting method and the monocrystalline silicon are diffusion-bonded.

3. The hybrid silicon wafer according to claim 2, wherein an area ratio of the monocrystalline silicon of the silicon wafer relative to an entire area of a surface of the silicon wafer is 30% or more.

4. The hybrid silicon wafer according to claim 3, wherein purity of the polycrystalline silicon of the silicon wafer excluding gas components is 6N or higher, a total amount of metal impurities is 1 wtppm or less, and, among the metal impurities, Cu, Fe, Ni, and Al are respectively 0.1 wtppm or less.

5. The hybrid silicon wafer according to claim 4, wherein C and O as the gas components of the polycrystalline silicon of the silicon wafer are respectively 100 wtppm or less.

6. The hybrid silicon wafer according to claim 5, wherein the wafer is a disk shape, and a diameter of the wafer is 400 mm or more.

7. The hybrid silicon wafer according to claim 1, wherein an area ratio of the monocrystalline silicon of the silicon wafer relative to an entire area of a surface of the silicon wafer is 30% or more.

8. The hybrid silicon wafer according to claim 1, wherein purity of the polycrystalline silicon of the silicon wafer excluding gas components is 6N or higher, a total amount of metal impurities is 1 wtppm or less, and, among the metal impurities, Cu, Fe, Ni, and Al are respectively 0.1 wtppm or less.

9. The hybrid silicon wafer according to claim 8, wherein C and O as the gas components of the polycrystalline silicon of the silicon wafer are respectively 100 wtppm or less.

10. The hybrid silicon wafer according to claim 1, wherein the wafer is a disk shape, and an outer diameter of the wafer is 400 mm or more.

* * * * *